United States Patent [19]
Lee et al.

[11] Patent Number: 5,593,911
[45] Date of Patent: Jan. 14, 1997

[54] METHOD OF MAKING ESD PROTECTION CIRCUIT WITH THREE STAGES

[75] Inventors: Jin-Yuan Lee; Mong-Song Liang, both of Hsin-Chu, Taiwan

[73] Assignee: Taiwan Semiconductor Manufacturing Company Ltd., Hsin-Chu, Taiwan

[21] Appl. No.: 507,143

[22] Filed: Jul. 26, 1995

[51] Int. Cl.⁶ .............................................. H01L 21/8234
[52] U.S. Cl. .................. 437/51; 437/56; 437/918
[58] Field of Search .................. 437/34, 51, 56, 437/57, 58, 59, 60, 918; 148/DIG. 136

[56] References Cited

U.S. PATENT DOCUMENTS

| | | | |
|---|---|---|---|
| 3,407,339 | 10/1968 | Booher | 257/360 |
| 4,527,213 | 7/1985 | Ariizumi | 361/56 |
| 4,821,096 | 4/1989 | Maloney | 257/360 |
| 5,158,899 | 10/1992 | Yamagata | 437/51 |
| 5,246,872 | 9/1993 | Mortensen | 437/56 |
| 5,547,887 | 8/1996 | Brown et al. | 437/51 |

*Primary Examiner*—Chandra Chaudhari
*Attorney, Agent, or Firm*—George O. Saile; Graham S. Jones, II

[57] ABSTRACT

An MOS electrostatic discharge, ESD, protection circuit for protecting semiconductors from ESD damage is formed on a doped silicon substrate. The circuit includes three stages. The first stage includes a first MOSFET transistor and a grounded region formed in the substrate. The first MOS transistor has a source/drain circuit connected between the first node and ground, and has a control gate electrode connected to ground. The second stage includes a string of MOSFET transistors connected in a series string. The transistors in the string are in sufficient number to provide a circuit which will conduct at a high current level to protect the output circuit from overvoltage when the voltage exceeds a critical value. The third stage includes a third stage MOSFET device with a control gate connected to the second stage output and to the output of the circuit. The source and drain circuit of the third stage device are connected between the third node and the ground connection.

14 Claims, 4 Drawing Sheets

METHOD OF MAKING ESD PROTECTION CIRCUIT WITH THREE STAGES

BACKGROUND OF THE INVENTION

1. Field of the Invention

This invention relates to semiconductor devices and more particularly to protection of semiconductor devices from problems attributable to excess energy.

2. Description of Related Art

Static charge can build up in integrated circuits, such as MOSFET semiconductor devices, to unacceptable levels in normal use. When the charge reaches a critical level the static charge is discharged in the integrated circuit, in an phenomenon known as ElectroStatic Discharge (ESD). The voltages reached during an ESD discharge event range as high as 1K Volts. Such voltages can damage the semiconductor circuits including the semiconductor MOSFET devices, or the metal contacts associated with the devices due to overheating caused by the excess heat the device dissipates during and ESD event. The amount of power which is converted into overheating is proportional to the square of the voltage reached; and the voltage reached is dependent on the breakdown voltage of the affected device.

Thick field oxide (FOX) devices have been used in input protection schemes also, but the disadvantage they have is high turn on voltage, usually larger than 12 Volts U.S. Pat. No. 4,821,096 of Maloney for "Excess Energy Protection Device" shows ESD protection devices for MOSFET devices, using PMOS devices as protection devices, but there is no suggestion of using a series of MOS devices to modify the protection device.

The Maloney patent describes the background of ESD, pointing out that it is known that by coupling to the protected device, devices which have lower breakdown voltages, the power dissipated will be decreased, reducing the effect of heat in device failure. By dissipating the excess energy through a protecting device, the active device is not exposed to voltage levels which can cause failure. Certain types of excess energy events can adversely affect integrated circuits. Integrated circuits can be affected by other energy events from other sources, for example, voltage and current surges. These events create excess electrical energy to be dissipated within the circuits. The energy discharge path is from an input/output pad to ground and can involve the initial stages of the integrated circuit. If the excess energy event exceeds the oxide breakdown voltage of a device in the initial stage, oxide breakdown, damage and even failure result. Additionally, metal/silicon contacts and PN junctions may be thermally damaged as a result of the heat dissipated from the excess energy event.

To limit the impact of excess energy events, protection devices are inserted between the pad and the initial stage of the integrated circuit.

One protection device consists of a pair of diodes coupled to the input. One diode is coupled to a high power supply voltage level and the other is coupled to a low power supply voltage level or ground. A disadvantage of such a protection device is the excessively high voltage reference coupled to the first transistor.

A second protection device consists of a grounded gate n-channel transistor coupled through a resistor to a pad. This device is not always effective in CMOS applications. Studies have shown that the resistor fails or that n-channel devices fail during high energy events because of alloy spiking of the N+ junction. In N-MOS processing, this defect can be overcome by utilizing deep N+ junctions.

However, in CMOS processing shallow N+ junctions are often employed. As a result, the alloy spiking causes failure of N-channel protection devices. This defect can be overcome by enlarging the contact to gate spacing, but this requires additional silicon area which adds to the size of the integrated circuit.

U.S. Pat. No. 4,527,213 of Ariizumi for "Semiconductor Integrated Circuit Device with Circuits for Protecting an Input Section Against an External Surge" does not use a series of MOS devices to modify the gate voltage of the protection device.

U.S. Pat. No. 3,407,339 of Booher for "Voltage Protection Device Utilizing a Field Effect Transistor" uses a series of field effect transistors with drains coupled to gates for limiting the input voltage. However, Booher does not use this series of transistors to modify the gate voltage of the protection device. This type of protection circuit is not effective for MOS devices avoiding excessive static charge damage, because the excessive static charges must pass through several transistors from the input pad to ground.

SUMMARY OF THE INVENTION

This invention is particularly directed to providing a solution to the problem of ESD device failure due to the problem of gate oxide breakdown.

In accordance with this invention, NMOS devices are used as protection devices and a series of NMOS with drains coupled to gates modify the gate voltage of a protection device.

In accordance with this invention the breakdown voltage of ESD devices is reduced to improve ESD performance.

In accordance with this invention, we use NMOS devices as a protection device and a series of NMOS devices with drains coupled to control gates to modify the gate voltage of the protection device.

Further in accordance with this invention, we use a series of NMOS devices with drains coupled to control gates to modify the gate voltage of a protected device. The excessive electric charges need pass through only one transistor from input pad to ground.

In one aspect of this invention, a MOS electrostatic discharge, ESD, protection circuit for protecting a semiconductor device from ESD damage is formed on a doped silicon semiconductor substrate. A method of manufacture of such a device is provided also. The device includes an input line, an output line, a first node, a second node and a third node, and ground connections. First and second resistors each have a proximal end and a distal end. The first node is connected to the input line, and the proximal end of the first resistor. The second node is connected to the proximal end of the second resistor, and the distal end of the first resistor. The third node is connected to the distal end of the second resistor, and the output line. The first stage includes a first MOSFET transistor and a grounded region formed in the substrate. The first MOS transistor has a source/drain circuit connected between the first node and ground, the first MOS transistor having a control gate electrode connected to ground. The second stage includes a string of MOSFET transistors connected in a series string with the last transistor in the string having a second stage output. The third stage includes a third stage MOSFET device with a control gate connected to the second stage output and to the output of the circuit. The source and drain circuit of the third stage device are connected between the third node and the ground connection. The transistors dissipate power during an excess energy event to protect devices connected to the output of the circuit.

Preferably, the first transistor includes a source region and a drain region on either side of a field oxide region in the substrate, and a control gate formed over the field oxide region.

Preferably, the second stage includes a series of FET devices with the source drain circuits thereof connected in series and the control gate connected to the input lines closest to the second node.

Preferably, the second stage includes a series of FET devices with the source drain circuits thereof connected in series and the control gate connected to the input lines closest to the second node.

In accordance with another aspect of this invention, a MOS electrostatic discharge, ESD, protection circuit is provided for protecting a semiconductor device from ESD damage. The ESD protection circuit is formed on a doped silicon semiconductor substrate. The circuit includes an input line, an output line, a first node, a second node and a third node, and ground connections, first and second resistors each have a proximal end and a distal end. The first node is connected to the input line and the proximal end of the first resistor. The second node is connected to the proximal end of the second resistor and the distal end of the first resistor. The third node connected to the distal end of the second resistor and the output line. The first stage includes a first MOS transistor and a grounded region formed in the substrate. The first MOS transistor includes a first source region and a first drain region formed in the substrate, and a control gate electrode therebetween. The first drain region being coupled to the first node. The control gate electrode and the first source region being connected to the grounded region. The second stage includes a string of MOSFET transistors connected in a series string with the drain and the control gate of the first of the string connected to the distal end of the resistor. The third stage includes a third stage MOSFET device with a control gate connected to the output of the second stage and a source and drain circuit thereof connected between the third node and a the ground connection. The gate electrodes are formed of polysilicon with a thickness between 1,000 Å and 5,000 Å. The source/drain regions have been ion implanted with a dose between 1E15 ions/cm$^2$ and 7E15 ions/cm$^2$. The transistors dissipate power during an excess energy event.

Preferably, the first transistor includes a source region and a drain region on either side of a field oxide region in the substrate, and a control gate formed over the field oxide region.

Preferably, the second stage includes a series of FET devices with the source drain circuits thereof connected in series and the control gate connected to the input lines closest to the second node.

Preferably, the second stage includes a series of FET devices with the source drain circuits thereof connected in series and the control gate connected to the input lines closest to the second node.

In accordance with still another aspect of this invention, an MOS electrostatic discharge, ESD, protection circuit is provided for protecting a semiconductor device from ESD damage, the ESD protection circuit formed on a doped silicon semiconductor substrate comprises a series of stages. A first stage includes a first field effect transistor formed on the substrate, including a first electrode, a second electrode, and a control element. An output stage includes an output field effect transistor formed on the substrate, including a drain electrode, a source electrode, and a gate electrode. The second electrode and the control element are connected together and grounded to the substrate. The first electrode, which is connected to a first end of a first resistor, has its second end connected to a second stage including a chain of series connected field effect transistors, having a gate and a first electrode connected together, with the first electrode of the first transistor in the chain connected to the resistor and the second electrode of each transistor in the chain connected to the first electrode and the control element of the succeeding transistor in the chain, the control element of the final transistor in the chain connected to the gate electrode of the output stage. A second resistor has its first end connected to the second end of the first resistor, the second resistor has a second end. The drain electrode of the third stage connected to the second end of the second resistor and the source electrode of the third stage grounded to the substrate.

Preferably, the first transistor includes a drain region connected to the first electrode and a source region connected to the second electrode, the drain region and the source region being on either side of a field oxide region in the substrate, and the control element formed over the field oxide region.

Preferably, the second stage includes a series of FET devices having source drain circuits connected in series and the control gate connected to the input lines closest to the second node.

Preferably, the second stage includes a series of FET devices with the source drain circuits connected in series and the control gate connected to the input lines closest to the second node.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
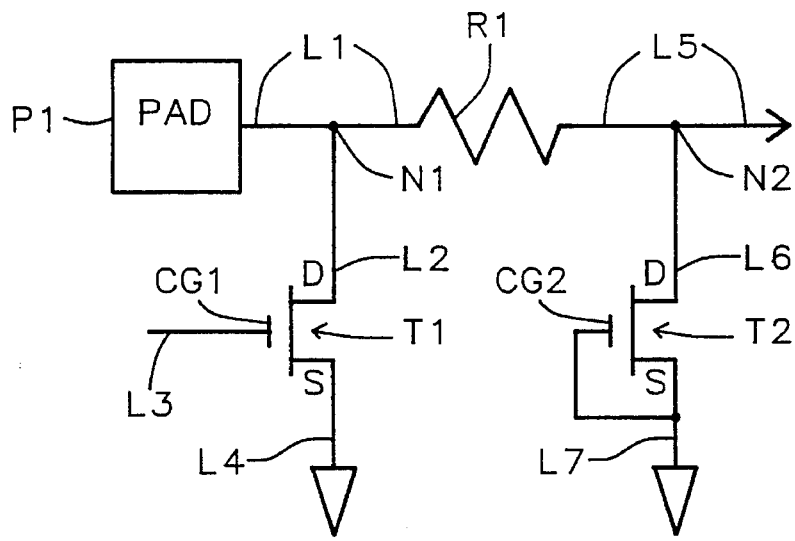
FIG. 1 shows a simple two stage ESD protection circuit which is relatively likely to fail due to gate oxide breakdown, when voltages exceed a critical limit.

FIG. 1 illustrates a simple two stage ESD protection circuit with limited capacity to protect against large voltages. A contact pad P1 connected via line L1 through node N1 to the proximal end (close end) of resistor R1. Node N1 is connected via line L2 to the drain of an NMOS MOSFET device T1, the source of which is connected to ground through line L4. The control gate CG1 of device T1 is connected via line L3 to ground or which remains floating. The distal end of resistor R1 is connected via line L5 through node N2 as indicated by the arrow to the input buffer circuits (not shown) to be protected. Connected between node N2 and ground is a grounded gate NMOS device T2. The drain of device T2 is connected to node N2 and the source of device T2 is connected through line L7 to ground. The control gate CG2 of device T2 is also connected to ground through line L7.

The device T2 operates when line L7 is connected to ground. When the voltage of node N2 is higher than junction breakdown voltage of device T2, the electric charges pass through device T2.

A hypothetical alternative to FIG. 1 would be to connect the control gate CG2 of device T2 to the drain D rather than to source S. In the case of connecting the control gate CG2 to line L6 and to the drain of device T2, device T2 would always be turned on as the voltage of the drain would always be higher than the threshold voltage of device T2. Accordingly, the device T2 would be very leaky under normal operation voltage and would not function adequately.

FIRST PREFERRED EMBODIMENT OF INVENTION

Figure 2:
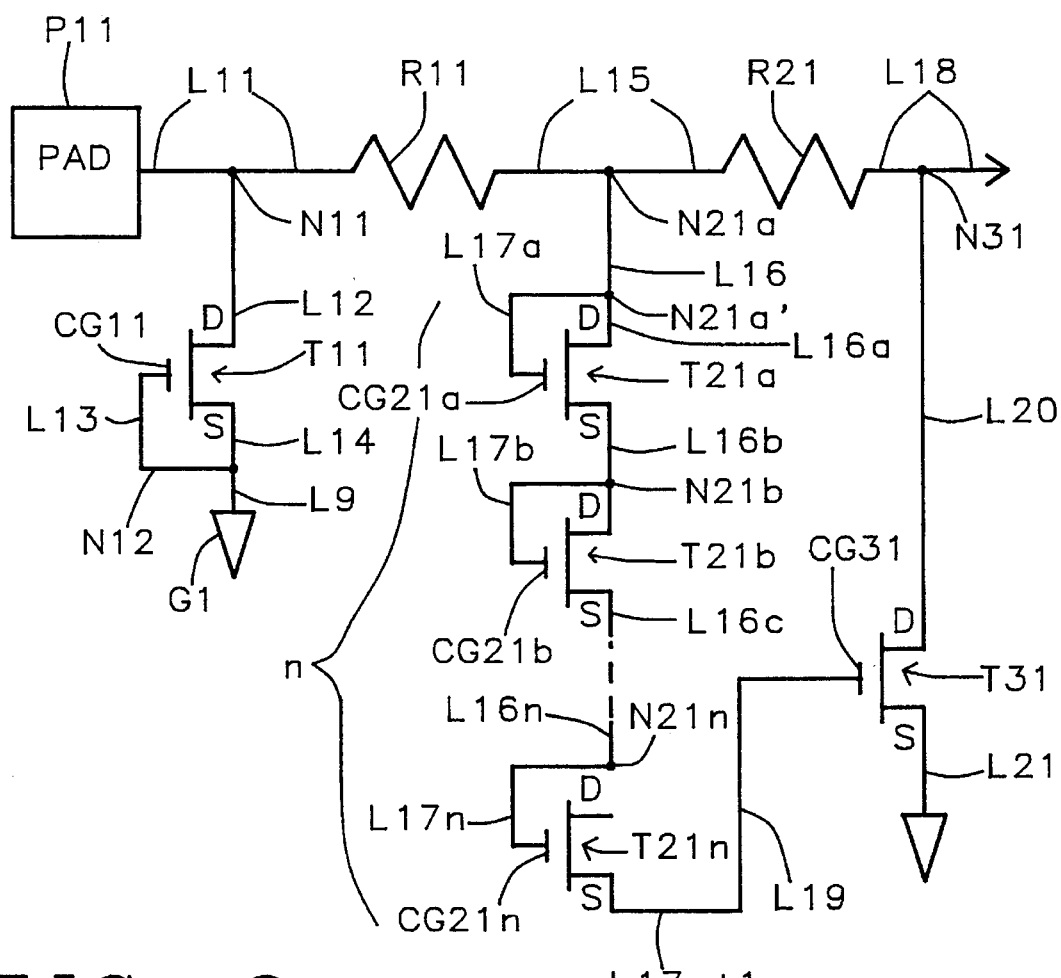
FIG. 2 shows a preferred ESD protection circuit in accordance with this invention with a three stage ESD circuit.

FIG. 2 shows a preferred ESD protection circuit in accordance with this invention with a contact pad P11 connected to the first stage of a three stage ESD circuit.

First Stage

The first stage is connected to contact pad P11 via line L11 through a node N11 to the proximal end of resistor R11. Node N11 is connected via line L12 to the drain of an NMOS MOSFET device T11, the source of which is connected to ground through line L14. The control gate CG11 of device T11 is connected via line L13 to line L9 which in turn is connected to ground.

The distal end (far end) of resistor R11 is connected via line L15 to node N21a, which is connected to line L14 and to the proximal end of resistor R21 which is connected at its distal end to line L18 which, as indicated by the arrow is connected to the input buffer of the circuit to be protected (not shown for convenience of illustration.)

Second Stage

The drain of device T21a is connected through line L16a to node N21a'. Node N21a' is connected via line L16 to node N21a. Node N21a' is also connected via line L17a to the control gate CG21a of device T21a. The source region S21a of device T21a is connected through line L16b to node N21b. Node N21b is connected to the drain region D21b and via line L17b to control gate CG21b. Thus the drain D21b and the control gate CG21b of device T21b are connected to the source of device T21a, as well.

The source S21b of device T21b is connected through line L16c to the drain and the control gate of an NMOS FET device (T21c not shown.) The sequence (string) of FET devices can continue as an array of FET devices T21d . . . T21n-1 which also are not shown, depending upon the number of stages of devices required.

At the end of the string of devices, there is a line L19 which is connected from the source S of transistor T21n, (which is the last FET in the chain T21a, T21b, . . . T21n) to the control gate CG31 of device T31.

The manner in which a circuit in accordance with this invention works with the drains connected to the control gates in FIG. 2 is described next. The voltage of the source of FET device T21n will be the voltage of node N21a minus the sum of the threshold voltages of the intervening FET devices T21a, T21b . . . and T21n, assuming that the voltage at node N21a is larger than the sum of threshold voltage of devices T21a, T21b . . . and T21n. In addition, the voltage of the source of device T21n will be nearly zero normally, if the voltage of node N21a is less than the sum of the threshold voltage of devices T21a, T21b . . . and T21n. By choosing the proper quantity of devices T21a, T21b . . . and T21n, the sum of the threshold voltages T21 . . . T21n and the protection device T31 is just larger than normal operation voltage. As a result, the protection device will not be turned on under normal operation conditions, yet this protection device will be turned on if the voltage on node N21a is higher than normal operation voltage. The junction breakdown voltage of the protection device T31 will be reduced if this protection device is turned on. The efficiency of the protection device can be enhanced by reduction of its junction breakdown voltage.

The manner of operation of the series string of transistors T21a–T21n is described above.

Third Stage

The third stage of the circuit in FIG. 2 is connected from the source of transistor T21n via line L19 which connects to the control gate CG31 of FET T31.

In the third stage, FET T31 has its drain D31 connected by line L20 via node N31 to line L18. The source S31 of FET T31 is connected by line L21 to ground.

Thus, between node N31 and line L21, connected to ground, are the drain and the source of NMOS device T31.

Figure 3:
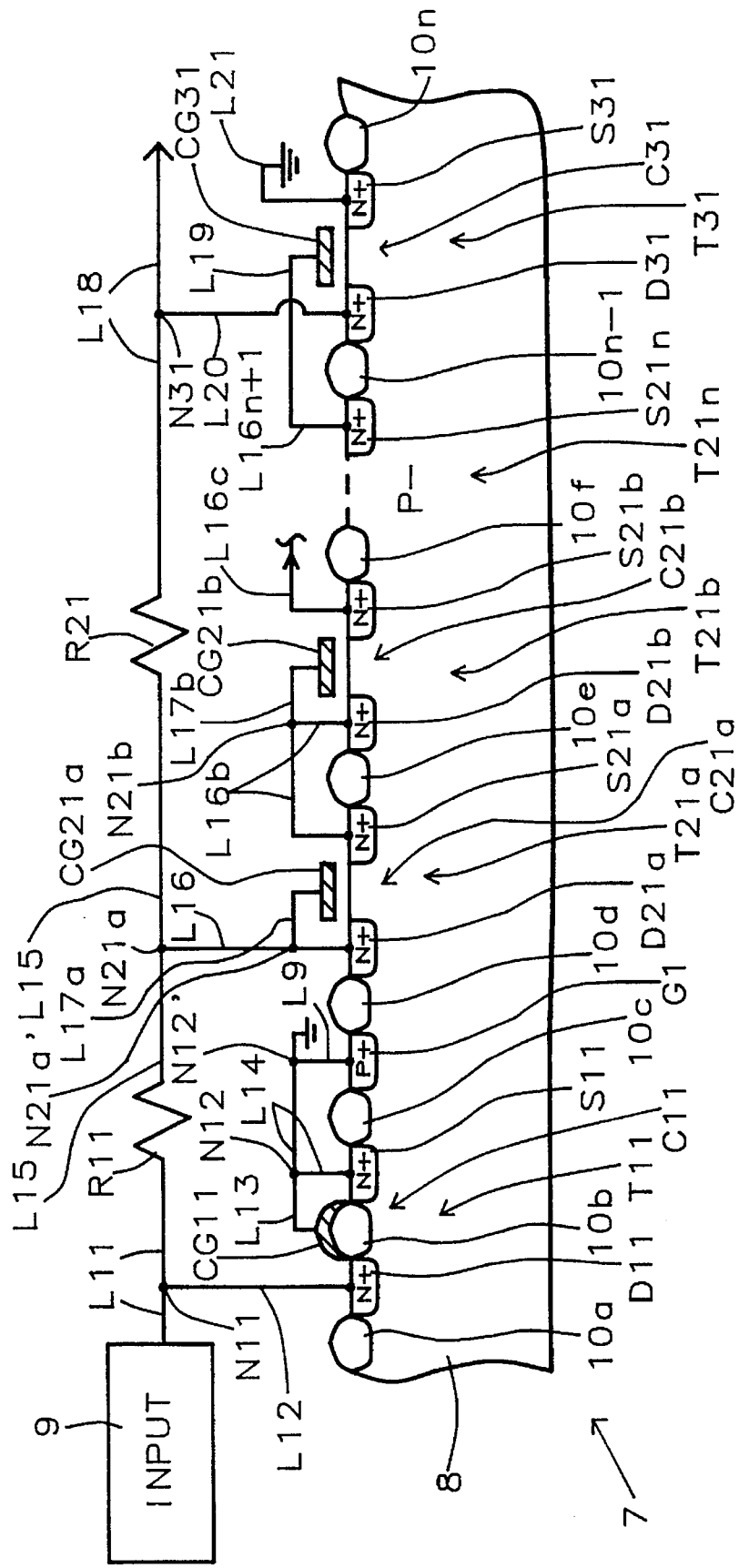
FIG. 3 shows a combined schematic circuit diagram and a cross section of the device of FIG. 2.

FIG. 3 shows a combined schematic circuit diagram and a cross section of the device of FIG. 2.

The device 7 includes a P-doped silicon semiconductor substrate 8 (or P-well) upon the surface of which a plurality of field oxide (FOX) regions 10a, 10b, 10c, 10d, 10e, 10f . . . 10n-1, 10n have been formed from left to right.

First Stage

Formed between FOX regions 10a and 10c is transistor T11 which includes the N+ drain region D11 between FOX regions 10a and 10b, and the N+ source region S between FOX regions 10b and 10c. Over the FOX region 10b is formed the control gate CG 11 between the N+ drain region D11 and the N+ source region S11. Beneath the FOX region 10b is the channel C11 of transistor T11. Drain region D11 is connected to line L12. Source region S11 is connected to line L14, which is connected to line L14 which connects through node N12 and node N12' to P+ region G1 between FOX regions 10c and 10d. Region G1 is P+ in a P− substrate or P-well 8 so the region G1 is grounded to the potential of the substrate 8. The P+ region G1 in this circuit serves as a ground contact region. Control gate CG 11 is connected via node N12 and line L14 to both source region S11 and P+ region G1.

Second Stage

Formed between FOX regions 10d and 10e is transistor T21a which includes the N+ drain region D21a, the N+ source region S21a, the channel C21a and the control gate CG21a. Between the drain region D21a and the source region S21a is the channel C21a over which is formed the control gate CG21a. Drain region D21a is connected to line L16a, which is connected via line L17a to control gate CG21a. Source region S21a is connected to line L16b.

Formed between FOX regions 10e and 10f is transistor T21b which includes the N+ drain region D21b, the N+ source region S21b, the channel C21b and the control gate CG21b. Between the drain region D21b and the source region S21b is the channel C21b over which is formed the control gate CG21b. Drain region D21b is connected via node N21b to line L16b, which is connected to source S21a of the previous transistor in the chain. Source region S21b is connected to line L16c.

Formed to the right of FOX region 10f would be transistor T21c which is not shown since the drawing shows but a fragment of the overall device with an intermediate section deleted for convenience of illustration.

Formed farther to the right of FOX region 10f is a portion of transistor T21n which includes the source region S21n, (located to the left of FOX region 10n-1) connected through line L16n+1 to line L19 to the control gate CG31 of the third stage of the circuit.

Third Stage

Formed between FOX regions 10n-1 and 10n is transistor T31 which includes the N+ drain region D31 to the right of FOX region 10n-1 and the N+ source region S31 to the left of FOX region 10n, farthest to the right. Between the N+ drain region D31 and the N+ source region S31 is formed the control gate CG31 over the channel region C31. Drain region D31 is connected via line L20 to node N31, which connects to line L18 to the output of the device of FIG. 3, as described above in connection with FIG. 2. Source region S31 is connected via line L14 to ground.

The control gate CG31 is connected via line L19 to node N21n and source region Sn as described above to lower node N31 to ground when an overvoltage has appeared at node N21a, which has caused the combined threshold voltages of the devices T21a, T21b . . . T21n to be exceeded.

Operation of the circuit of FIGS. 2 and 3.

a. Negative ESD charge: Referring to FIG. 3, there is a forward bias of the N+ regions (Source/Drain regions) with respect to substrate (or P-well) 8, so that charge is easily conducted to ground due to the forward bias.

The charge flows from n+ drain region D11 in FIG. 3 and where the charge flows to P+ region G1 in FIG. 3.

b. Positive ESD charge: Positive charge passes through the protection device to ground by device breakdown. In this sense junction device breakdown occurs when a sufficiently high voltage is reached at which the device conducts charge in the reverse direction with a very large current. To prevent excessive heating of the device during junction breakdown, maximum power must be limited to minimize heating to a level at which no damage occurs. In the device of this invention, the breakdown voltage of the protection device is reduced by modifying the gate voltage.

In accordance with this invention, to reduce the breakdown voltage of an ESD protection device, no ground gate ESD protection device is used; and in the second stage of a three stage device NMOS devices are arranged in a series string which is connected between an I/O pin and the gate of an ESD device in the third stage of the circuit.

The breakdown voltage $V_{BD}$ with a circuit in accordance with this invention is as follows:

$$V_{BD} > n * V_t \geq V_D$$

n: number of stages of devices in ESD chain $V_{BD}$: breakdown voltage of gate oxide $V_D$: normal operation voltage of circuit. (where $V_{DD}$ is drain supply voltage)

$V_t$: Threshold voltage where the minimum value of n=2.

For example, if n=2, then $$V_{BD} > 2 * V_t \geq V_D$$

For example, if n=3, then $$V_{BD} > 3 * V_t \geq V_D$$

* Device breakdown voltage is a function of gate voltage.

The device breakdown voltage of an NMOS * with positive gate voltage is lower than the ground gate transistor's breakdown voltage.

Process of forming device of FIG. 3.

The semiconductor fabrication process (recipe) for forming the devices of FIG. 3 is a conventional CMOS process. Stages 1, 2 and 3 are all made by the same process which is as follows:

Fox Mask for Ion Implanting
  Dosage Levels 1E12 ions/cm$^2$ TO 6E13 ions/cm$^2$
  Power Levels 20 keV to 200 keV
GOX (Gate oxide:silicon dioxide),
  Method of Forming: Thermal growth or CVD silicon dioxide Thickness Range 40 Å to 200 Å
Gate Electrodes
  Polysilicon Blanket Thickness Range 1,000 Å to 5,000 Å.
Mask Pattern
  Etch Polysilicon with $CHF_3/CF_4/HBr/Cl_2/Ar/He/O_2$
  Remove Mask
S/D Ion Implant Steps
  Dosage Levels 1E15 ions/cm$^2$ to 7E15 ions/cm$^2$
  Power Levels 10 keV to 100 keV
Stage 1 Ground (G1) ion implant steps
  Dosage Levels 1E15 ions/cm$^2$ to 7E15 ions/cm$^2$
  Power Levels 10 keV to 100 keV

SECOND PREFERRED EMBODIMENT OF INVENTION

Figure 4:
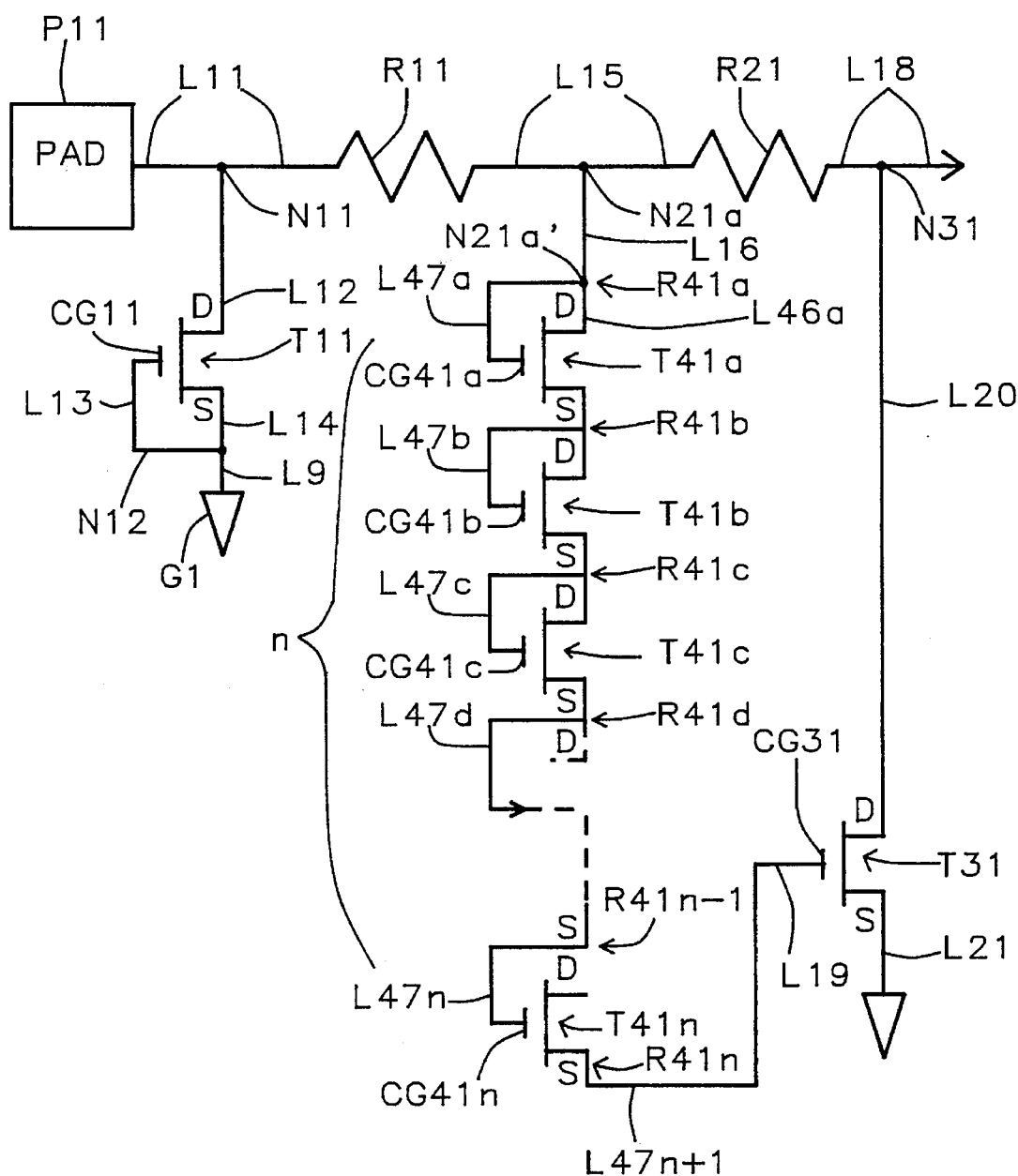
FIGS. 4 and 5 show a second preferred ESD protection circuit in accordance with this invention including three stages as in FIGS. 2 and 3. The first and third stages of the circuit are identical to the first and third stages of FIG. 3.
Figure 5:
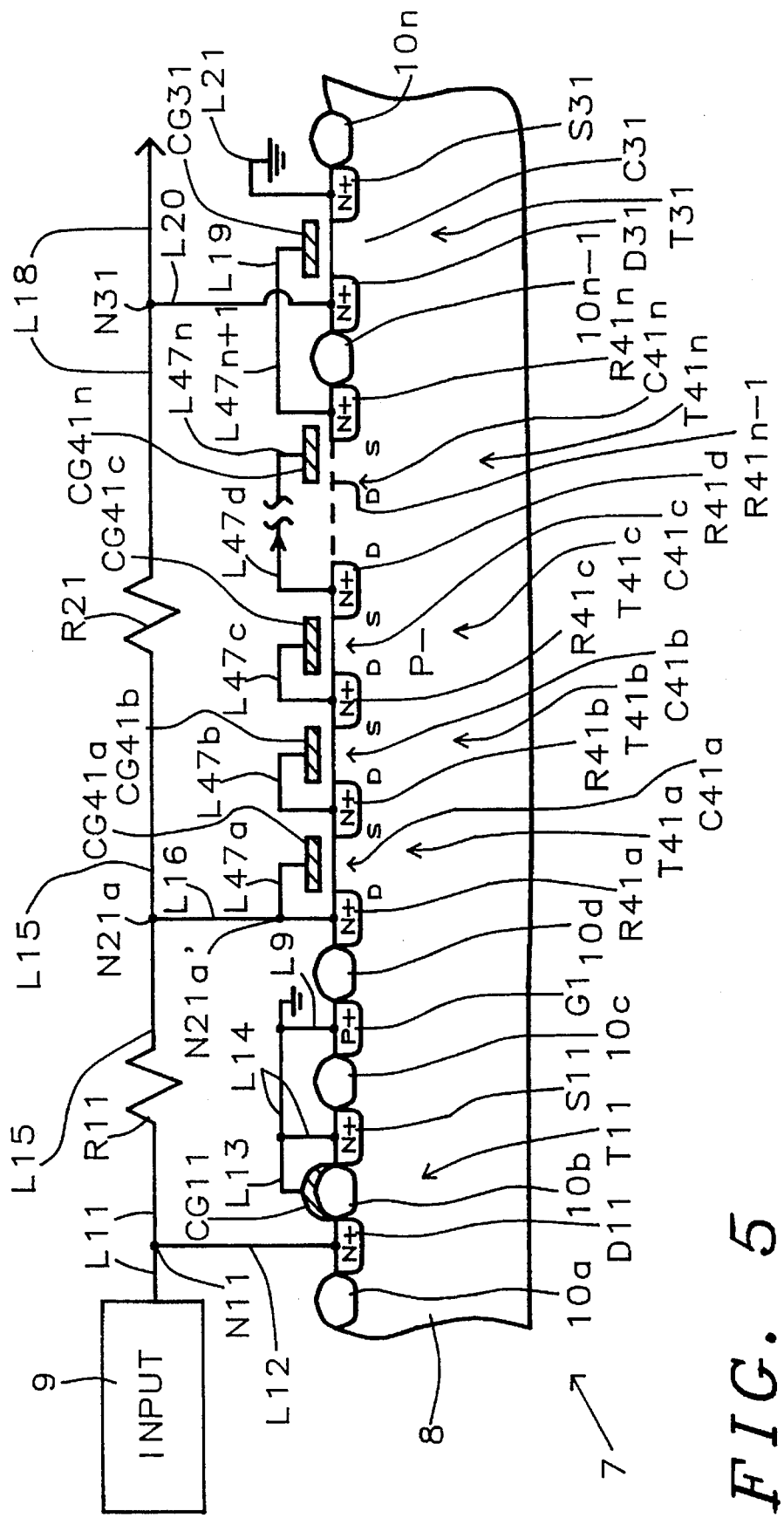

FIGS. 4 and 5 show a second preferred ESD protection circuit in accordance with this invention including three stages as in FIGS. 2 and 3. The first and third stages of the circuit are identical to the first and third stages of FIGS. 2 and 3, so the description will be not include a description of the first stage. A brief description of the Third Stage of the circuit follows the description of the modified Second stage.

Second Stage

It should be noted that the second stage has FET devices which share source/drain regions between successive devices. The string of FETs T41a, T41b, T41c, . . . T41n comprises a set of combined source/drain regions R41b, R41c, R41d, . . . R41n-1. For example, the N+ region R41b serves at one end thereof as the source region of transistor T41a and at the opposite end thereof as the drain region of transistor T41b as shown in FIG. 5, thereby eliminating the need for a wired connected therebetween.

Referring to FIGS. 4 and 5, line L15 is connected from node N21a through which it passes to line L16. Node N21a' connects from line L16 to lines L46a and L47a. Line 46a connects node N21a' to the drain of N+ doped region R41a of device T41a. Line L47a connects to the control gate CG41a of NMOS FET device T41a, having as its source a portion of N+ region R41b in substrate 8.

The drain portion of N+ doped region R41b of device T41b is connected through line L47b to the control gate CG41b of device T41b, having as its source a portion of N+ region R41c in substrate 8.

The drain portion of N+ doped region R41c of device T41c is connected through line L47c to the control gate of an NMOS FET device T41c, having as its source a portion of N+ region R41d in substrate 8.

The drain region of N+ doped R41d of device T41d is connected through line L47d to the control gate of an NMOS FET device (device T41d not shown.)

The sequence (string) of FET devices can continue as an array of FET devices T41e . . . T41n-1 which also are not shown, depending upon the number of stages of devices required.

At the end of the string of devices, there is a line L47n from the source portion of N+ region (R41n-1 not shown) of a device (FET T41n-1, not shown for convenience of illustration) connected to the control gate CG41n of device T41n, which is the last device in the second stage.

From the source in doped N+ region R41n, there is a line L47n+1 of device T41n which connects to the input line L19 of the third stage.

Third Stage

The drain of device R41n (comprising N+ doped region R41n) is connected by line L47n+1 which becomes line L19 to control gate CG31 of device T31, which has the same structure as the third stage of FIGS. 2 and 3. Referring to FIG. 5, on the right side of the region R41n is located a FOX region 10n-1, next to which is formed the N+ doped drain region D31 on the left of control gate CG31. Drain region D31 is connected by line L20 to node N31, which connects to line L18. To the right side of control gate CG31 is the N+ source region S31 (connected via line L21 to ground), adjacent to FOX region 10n.

Referring again to FIG. 5 a combined schematic circuit diagram and a cross section of the device of FIG. 4 are shown.

In FIG. 5, the string of devices is formed between the two FOX regions 10d and 10n-1 without any other FOX regions in between. Region R41a of an NMOS FET device T41a is formed to the right of FOX region 10d, with the channel C41a of device T41a next followed by the N+ doped region R41b thereof.

Above the channel C41a is the control gate CG41a of device T41a. Line L15 is connected through node N21a where it joins lines L47a which connect to the N+ region D21a of device T41a and the control gate CG41a.

To the right of the N+ doped region R41b is the channel C41b of NMOS FET device T41b. Above channel C41b is found control gate CG41b of device T41b. N+ doped region R41b is connected through line L47b to the control gate CG41b of device T41b.

To the right of channel C41b is the N+ doped region R41c of device T41c which is connected through line L47c to the control gate CG41c of an NMOS FET device T41c.

The N+ doped region R41d of device T41d (not shown) is connected through line L47d to the drain and the control gate of an NMOS FET device T41d (not shown.)

The sequence (string) of FET devices can continue as an array of FET devices T41e . . . T41n-1 which also are not shown, depending upon the number of stages of devices required.

Near the end of the string of devices, there is a line L47n from the source S41n-1 (not shown) of device FET T41n-1 (also not shown) connected to the control gate CG41n of device T41n.

Process of forming device of FIGS. 4 and 5

The semiconductor fabrication process (recipe) for forming the devices of FIGS. 4 and 5 is a conventional CMOS process which is the same as the process for FIG. 3. Stages 1, 2 and 3 are all made by the same process.

Fox Mask for Ion Implanting
  Dosage Levels 1E12 ions/cm$^2$ TO 6E13 ions/cm$^2$
  Power Levels 20 keV to 200 keV
GOX (Gate oxide:silicon dioxide),
  Method of Forming: Thermal growth or CVD silicon dioxide Thickness Range 40 Å to 200 Å
Gate Electrodes Polysilicon Blanket
  Thickness Range 1,000 Å to 5,000 Å.
Mask Pattern
  Etch Polysilicon with $CHF_3/CF_4/HBr/Cl_2/Ar/He/O_2$
  Remove Mask
S/D Ion Implant Steps
  Dosage Levels 1E15 ions/cm$^2$ to 7E15 ions/cm$^2$
  Power Levels 10 keV to 100 keV
Stage 1 Ground (G1) ion implant steps
  Dosage Levels 1E15 ions/cm$^2$ to 7E15 ions/cm$^2$
  Power Levels 10 keV to 100 keV

SUMMARY

The transistors conduct at high levels of current in order to protect against overvoltage and to dissipate power during an excess energy event to protect devices connected to the output of the circuit.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming an MOS electrostatic discharge, ESD, protection circuit for protecting a semiconductor device from ESD damage, said ESD protection circuit formed on a doped silicon semiconductor substrate comprising:

forming a field oxide, FOX mask and ion implanting through said mask, forming a silicon dioxide gate oxide, forming gate electrodes by depositing a blanket polysilicon layer, forming a mask pattern for the gate electrodes and etching said blanket polysilicon layer to form said gates, removing said mask, ion implanting source/drain regions, and forming a ground ion implant, forming first and second resistors each having a proximal end and a distal end, forming an input line, an output line, a first node, a second node and a third node, and ground connections, said first node connected to said input line, and said proximal end of said first resistor, said second node connected to said proximal end of said second resistor, and said distal end of said first resistor, and said third node connected to said distal end of said second resistor, and said output line, forming a first stage including a first MOSFET transistor and a grounded region formed in said substrate, forming said first MOS transistor having a source/drain circuit connected between said first node and ground, said first MOS transistor having a control gate electrode connected to ground, forming a second stage including a string of MOSFET transistors connected in a series string with the last transistor in said string having a second stage output, forming a third stage including a third stage MOSFET device with a control gate connected to said second stage output and a source and drain circuit connected between said third node and a said ground connection.

2. The method of claim 1 including forming said field oxide mask and performing said field oxide ion implanting through said mask with a range of dosage levels between $1E12$ ions/cm$^2$ and $6E13$ ions/cm$^2$ with power levels between 20 keV and 200 keV, forming said silicon dioxide gate oxide by a method selected from thermal growth and CVD formation with a thickness between 40 Å and 200 Å, forming said gate electrodes by depositing a blanket polysilicon layer with a thickness between 1,000 Å and 5,000 Å, forming a mask pattern for the gate electrodes and etching said blanket polysilicon layer with $CHF_3$/$CF_4$/HBr/$Cl_2$/Ar/He/$O_2$, and removing said mask, ion implanting said source/drain regions with a dose between $1E15$ ions/cm$^2$ and $7E15$ ions/cm$^2$ at a power levels between 10 keV and 100 keV, and forming said ground ion implant with a dosage level between $1E15$ ions/cm$^2$ and $7E15$ ions/cm$^2$ at a power level between 10 keV and 100 keV.

3. The method of claim 1 wherein said first transistor includes a source region and a drain region on either side of a field oxide region in said substrate, and a control gate formed over said field oxide region.

4. The method of claim 3 wherein said second stage includes a series of FET devices with source drain circuits thereof connected in series and the control gate connected to the input lines closest to said second node.

5. The method of claim 1 wherein said second stage includes a series of FET devices with source drain circuits thereof connected in series and the control gate connected to the input lines closest to said second node.

6. A method of manufacture of an MOS electrostatic discharge, ESD, protection circuit for protecting a semiconductor device from ESD damage, said ESD protection circuit formed on a doped silicon semiconductor substrate comprising:

forming a field oxide, FOX mask and ion implanting through said mask, forming a silicon dioxide gate oxide, forming gate electrodes by depositing a blanket polysilicon layer, forming a mask pattern for the gate electrodes and etching said blanket polysilicon layer to form said gates, removing said mask, ion implanting source/drain regions, and forming a ground ion implant, providing an input line, an output line, a first node, a second node and a third node, and ground connections, providing first and second resistors each having a proximal end and a distal end, connecting said first node to said input line, and said proximal end of said first resistor, connecting said second node to said proximal end of said second resistor, and said distal end of said first resistor, connecting said third node to said distal end of said second resistor, and said output line, forming a first stage including a first MOS transistor and a grounded region formed in said substrate, said first MOS transistor including a first source region and a first drain region formed in said substrate, and a control gate electrode therebetween, said first drain region being coupled to said first node, said control gate electrode and said first source region being connected to said grounded region, forming a second stage including a string of MOSFET transistors connected in a series string with the drain and the control gate of the first of said string connected to the distal end of said resistor, forming a third stage including a third stage MOSFET device with a control gate connected to the output of said second stage and a source and drain circuit thereof connected between said third node and a said ground connection, whereby said transistors dissipate power during an excess energy event.

7. The method of claim 6 wherein said first transistor includes a source region and a drain region on either side of a field oxide region in said substrate, and a control gate formed over said field oxide region.

8. The method of claim 7 wherein said second stage includes a series of FET devices with source drain circuits thereof connected in series and the control gate connected to the input lines closest to said second node.

9. The method of claim 7 wherein said second stage includes a series of FET devices with the source drain circuits thereof connected in series and the control gate connected to the input lines closest to said second node.

10. A method of manufacture of an MOS electrostatic discharge, ESD, protection circuit for protecting a semiconductor device from ESD damage, said ESD protection circuit formed on a doped silicon semiconductor substrate comprising:

forming a field oxide, FOX mask and ion implanting through said mask, forming a silicon dioxide gate oxide, forming gate electrodes by depositing a blanket polysilicon layer, forming a mask pattern for the gate electrodes and etching said blanket polysilicon layer to form said gates, removing said mask, ion implanting source/drain regions, and forming a ground ion implant, forming a first stage including a first field effect transistor formed on said substrate, including a first electrode, a second electrode, and a control element, forming an output stage including an output field effect transistor formed on said substrate, including a drain electrode, a source electrode, and a gate electrode, forming said second electrode and said control element being connected together and grounded to said substrate, forming said first electrode connected to a first end of a first resistor having its second end connected to a second stage including a chain of a plurality of series connected field effect transistors, having a gate and a first electrode connected together, with the first electrode of the first transistor in said chain connected to said resistor and the second electrode of each transistor in said chain connected to the first electrode and the control element of the succeeding transistor in said chain, the control element of the final transistor in said chain connected to said gate electrode of said output stage, forming a second resistor having its first end connected to said second end of said first resistor, said second resistor having a second end, and forming a third stage including a drain electrode connected to said second end of said second resistor and a source electrode of said third stage grounded to said substrate.

11. The method of claim 10 wherein said first transistor includes a drain region connected to said first electrode and a source region connected to said second electrode, said drain region and said source region being on either side of a field oxide region in said substrate, and said control element formed over said field oxide region.

12. The method of claim 11 wherein said second stage includes a series of FET devices having source drain circuits connected in series and a control gate connected to the input lines closest to said second node.

13. The method of claim 10 wherein said second stage includes a series of FET devices with source drain circuits connected in series and a control gate connected to the input lines closest to said second node.

14. The method of claim 10 including forming said field oxide mask and performing said field oxide ion implanting through said mask with a range of dosage levels between 1E12 ions/cm$^2$ and 6E13 ions/cm$^2$ with power levels between 20 keV and 200 keV, forming said silicon dioxide gate oxide by a method selected from thermal growth and CVD formation with a thickness between 40 Å and 200 Å, forming said gate electrodes by depositing a blanket polysilicon layer with a thickness between 1,000 Å and 5,000 Å, forming a mask pattern for the gate electrodes and etching said blanket polysilicon layer with $CHF_3$/$CF_4$/HBr/$Cl_2$/Ar/He/$O_2$, and removing said mask, ion implanting said source/drain regions with a dose between 1E15 ions/cm$^2$ and 7E15 ions/cm$^2$ at a power levels between 10 keV and 100 keV, and forming said ground ion implant with a dosage level between 1E15 ions/cm$^2$ and 7E15 ions/cm$^2$ at a power level between 10 keV and 100 keV.

* * * * *